United States Patent [19]

Shindo

[11] Patent Number: 5,148,215
[45] Date of Patent: Sep. 15, 1992

[54] MAGAZINE UNIT OF IMAGE RECORDING APPARATUS FOR ACCOMMODATING IMAGE RECORDING MEDIUM

[75] Inventor: Tatsuya Shindo, Nagoya, Japan

[73] Assignee: Brother Kogyo Kabushiki Kaisha, Aichi, Japan

[21] Appl. No.: 794,119

[22] Filed: Nov. 15, 1991

[30] Foreign Application Priority Data

Nov. 16, 1990 [JP] Japan .................... 2-120564[U]

[51] Int. Cl.$^5$ .................................. G03B 27/58
[52] U.S. Cl. ............................................. 355/72
[58] Field of Search .................. 355/72, 309, 27; 354/174

[56] References Cited

U.S. PATENT DOCUMENTS

| | | | |
|---|---|---|---|
| 4,864,362 | 9/1989 | Hayashi et al. | 355/72 |
| 4,945,381 | 7/1990 | Yamagata et al. | 355/27 |
| 4,965,622 | 10/1990 | Ibuchi | 355/27 |
| 4,984,016 | 1/1991 | Makino et al. | 355/72 |
| 5,006,887 | 4/1991 | Ogura | 355/72 |
| 5,017,959 | 5/1991 | Ibuchi | 355/27 |
| 5,023,653 | 6/1991 | Yoshihara | 355/27 |
| 5,065,180 | 11/1991 | Shindo et al. | 355/72 |
| 5,066,973 | 11/1991 | Kuwabara | 355/27 |
| 5,077,575 | 12/1991 | Narumiya et al. | 355/72 |

*Primary Examiner*—Richard A. Wintercorn
*Attorney, Agent, or Firm*—Kane, Dalsimer, Sullivan, Kurucz, Levy, Eisele and Richard

[57] ABSTRACT

A magazine unit for an image recording apparatus such as a copying machine comprises a magazine body to be mounted in the housing of the copying machine through a opening formed at the machine housing, a first winding shaft around which a microcapsule sheet before use is wound, and a second winding shaft around which the microcapsule sheet after the use from the first winding shaft is taken up. The first and second winding shafts have substantially the same structure so as to be used commonly. Thus, a microcapsule sheet can be easily exchanged for a new one.

10 Claims, 5 Drawing Sheets

MAGAZINE UNIT OF IMAGE RECORDING APPARATUS FOR ACCOMMODATING IMAGE RECORDING MEDIUM

BACKGROUND OF THE INVENTION

This invention relates to an image recording apparatus such as a copying machine and more particularly to a magazine unit of the image recording apparatus for accommodating an image recording medium.

An image recording apparatus such as a copying machine generally includes a magazine or a magazine unit for accommodating a photosensitive pressure sensitive image recording medium, and in a conventional magazine for an image recording medium, a cylindrical winding shaft around which an elongated photosensitive pressure sensitive image recording medium such as microcapsule sheet is wound is rotatably accommodated in the magazine, and another winding shaft is mounted to be rotatable outside a magazine body for winding up a used photosensitive pressure sensitive image recording medium. Such a conventional magazine is disclosed in U.S. Pat. No. 4,864,362. In such a magazine, when the whole photosensitive pressure sensitive image recording medium has been used up and taken up around the winding shaft outside the magazine, the magazine body and the two winding shafts together with the used photosensitive pressure sensitive image recording medium are taken out from the image recording apparatus and new ones are thereafter mounted thereon.

However, in the described prior art technology, it is necessary to exchange the magazine body and the winding shafts for new ones and the used ones should be thrown away, thus being not economical and inconvenient.

SUMMARY OF THE INVENTION

An object of this invention is to substantially eliminate defects or drawbacks encountered to the prior art and to provide a magazine unit of an image recording apparatus, such as a copying machine for accommodating a photosensitive pressure sensitive image recording medium having a structure capable of re-using a magazine body and winding shafts around which the recording medium is to be wound.

This and other objects can be achieved according to this invention by providing a magazine unit of an image recording apparatus, comprising an outer housing to which an opening is formed, for accommodating an image recording medium, the magazine unit comprising a magazine body to be mounted in the housing of the image recording apparatus through the opening, a first winding shaft around which a sheet-like image recording medium before use is wound, the first winding shaft being detachably mounted to the magazine body, and a second winding shaft around which the sheet-like photosensitive pressure sensitive image recording medium after the use from the first winding shaft is taken up, the second winding shaft being detachably mounted to the magazine body, the first and second winding shafts having substantially the same structure so as to be used commonly.

The magazine body comprises a flat plate-like center frame constituting a bottom plate of the magazine body, a pair of end plates secured to the longitudinal ends of the center frame in a vertically standing manner, the end plates being provided with winding shaft support portions for detachably supporting the first and second winding shafts, respectively, a pair of reinforcing plates secured to and stretched between the end plates on both lateral sides of the center frame, and a holding member stretched between substantially the center portion of the end plates in parallel to the reinforcing plates for holding the image recording medium. The magazine body has a structure laterally symmetric with respect to a center line of the magazine body. And the winding shaft support portions are symmetric with respect to the center line of the magazine body.

The image recording medium is a microcapsule sheet comprising a base sheet or substrate and a microcapsule coated on the base sheet and containing a color copying coloring precursor and a light setting resin.

According to the magazine unit of the image recording apparatus such as a copying machine of the structure described above, the first and second winding shafts, i.e. a sheet feed shaft with the sheet-like image recording medium such as microcapsule sheet wound therearound and a vacant sheet take-up shaft, having a common shape are mounted to the support portions of the magazine body, and the magazine body is mounted in the image recording apparatus in this state. When the copying operation, for example, has been completed and the image recording medium on the sheet feed shaft is completely taken up around the sheet take-up shaft, the magazine body is taken out from the image recording apparatus for the exchanging of the used image recording medium for a new one. Thereafter, a new winding shaft around which a new image recording medium is wound replaces the sheet take-up shaft with the used image recording medium wound therearound and the vacant winding shaft, which is used as sheet feed shaft in the preceeding operation, is reused as a sheet take-up shaft. Accordingly, it is not necessary to throw away the used magazine body and the take-up shaft around which the used image recording medium is taken up, thus being economical.

BRIEF DESCRIPTION OF THE DRAWINGS

For a better understanding of this invention and to show how the same is carried out, reference is now made, by way of a preferred embodiment, to the accompanying drawings, in which.

DESCRIPTION OF THE PREFERRED EMBODIMENTS

Figure 1:
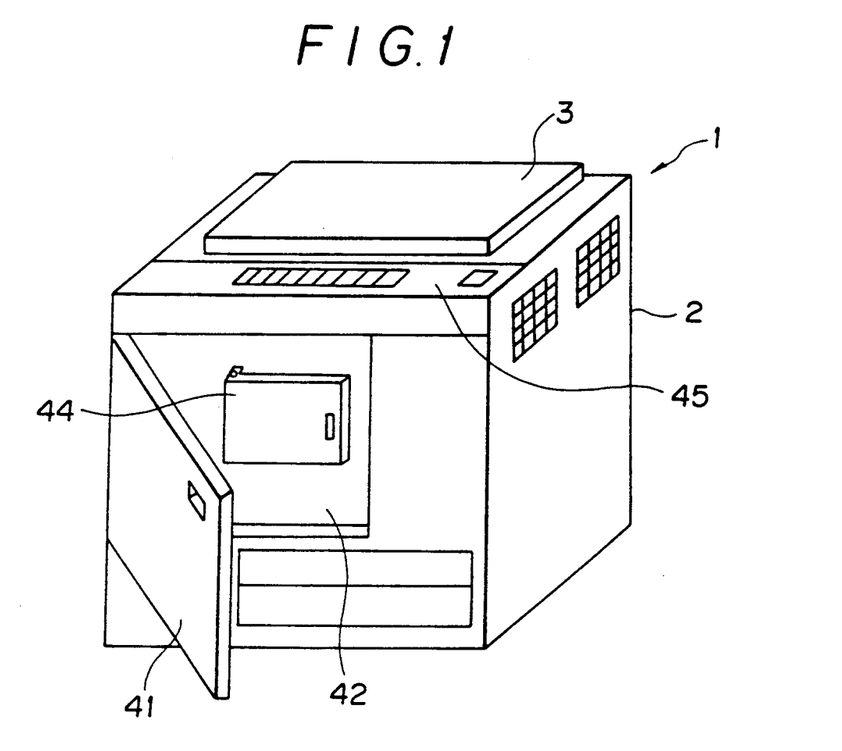
FIG. 1 is a perspective view of a copying machine as an image recording apparatus to which this invention is applicable.
Figure 2:
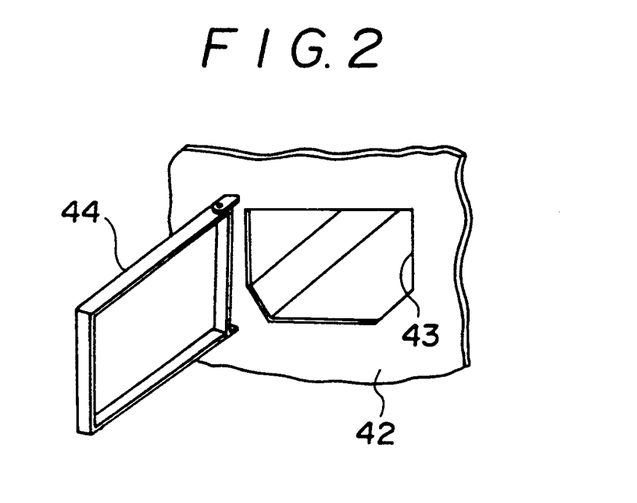
FIG. 2 is a perspective view of a magazine insertion portion of the copying machine of FIG. 1.

First, referring to FIGS. 1 and 2, a copying machine 1 as an image recording apparatus comprises a housing 2 provided with an upper portion as an original support portion which is closed or opened by a cover 3. A door 41 is attached to the front surface of the housing 2 of the copying machine 1 for easy access and inspection of the interior of the housing 2. As shown in FIG. 2, when the door 41 is opened, a front side inner portion 42 is exposed to which is formed an opening 43 for inserting and taking out a magazine, mentioned hereinafter, of the copying machine. A cover 44 is also provided for the inner portion 42 to open or close the opening 43, and a control panel 45 is disposed on the front portion of the upper surface of the housing 2 for operating the copying machine.

Figure 3:
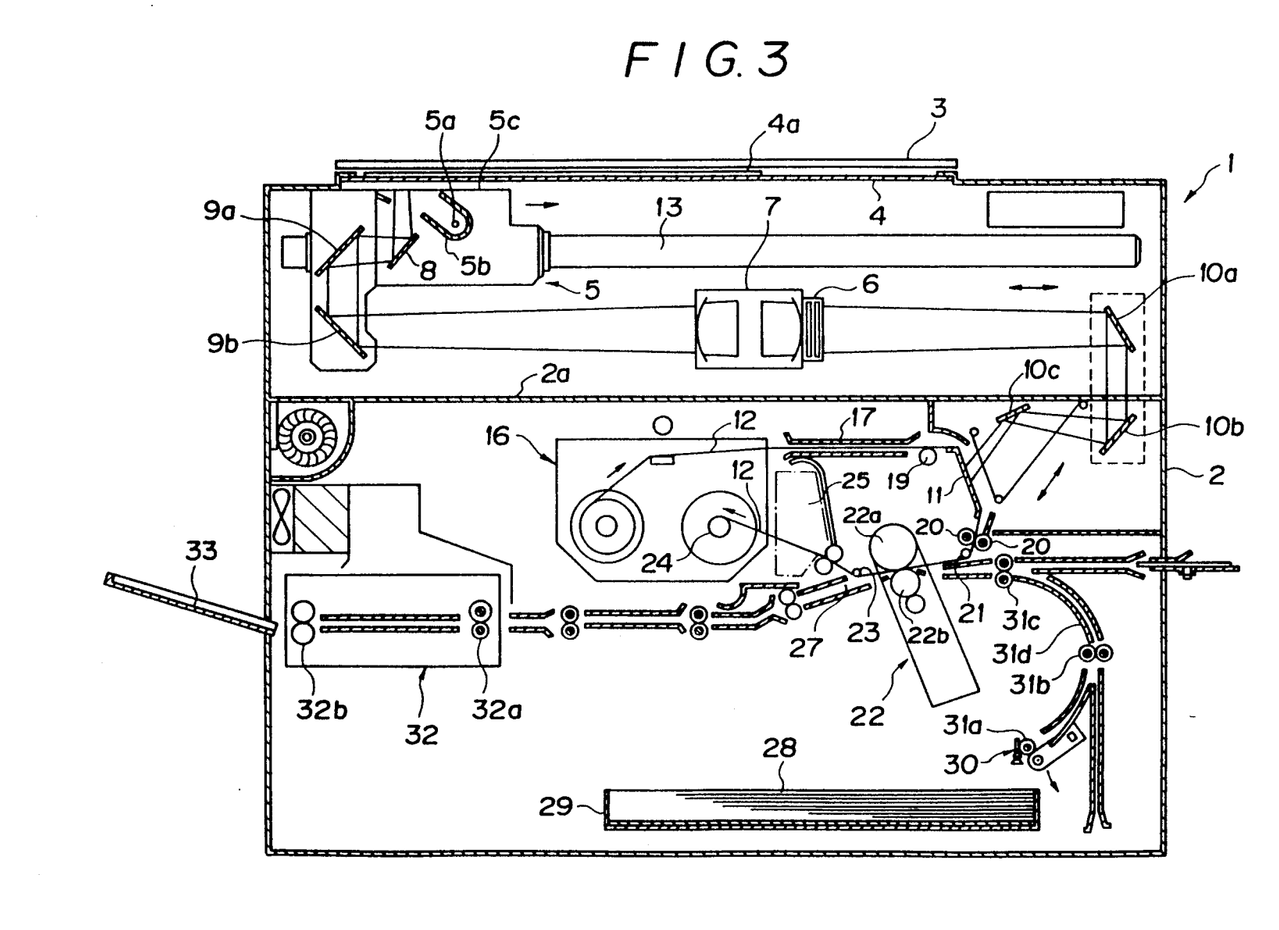
FIG. 3 is a schematic sectional front view of the copying machine for showing an interior arrangement thereof.

FIG. 3 shows an overall structure of the image recording apparatus as the copying machine 1 which generally employs an elongated photosensitive pressure sensitive image recording sheet or a microcapsule sheet 12 and a cut developer sheet or an output image recording sheet 28. The microcapsule sheet 12 has a substrate whose surface is coated with microcapsules encapsulating therein chromogenic materials reactable with a developer sheet 28. By this reaction, an output color image is provided on the developer sheet 28. Details of these image recording mediums are disclosed in a U.S. Pat. No. 4,399,209, and therefore, further description can be neglected.

At a top portion of the image recording apparatus 1, a transparent original support glass 4 for mounting thereon an original 4a is provided, and a support glass cover 3 is pivotally disposed over the original support glass 4. Between the support glass 4 and the cover 3, the original 4a is positioned with its imaging surface facing downwardly.

An optical system is provided below the original support glass 4. The optical system includes a light source 5 including a halogen lamp 5a, reflectors 5b, and a reflection mirror 8, and a frame member 5c is provided for housing therein the light source 5. The frame member 5c is formed with a slit for allowing light to pass therethrough toward the original support glass 4. A shaft 13 extends in parallel with the original support glass 4 and the frame member 5c is reciprocally movable along the shaft 13. The light source 5 provides a line light toward the original support glass 4 in a direction perpendicular to the moving direction of the frame member 5c. The light passing through the original support glass 4 is reflected at the original 4a and is directed downwardly.

The optical system also includes a first pair of reflection mirrors 9a and 9b supported by the frame member 5c but movable independent of the light source 5, another pair of reflection mirrors 10a and 10b, a projection lens 7, a filter unit 6 and a final reflection mirror 10c. The lens 7 and the filter unit 6 is positioned between the first and second pairs of the reflection mirrors 9a, 9b, 10a and 10b. The filter unit 6 is adapted for controlling color tone of a final output image. The light reflected from the original 4a is reflected at the reflection mirror 8 and the first pair of reflection mirrors 9a and 9b, so that the light is directed toward the second pair of the reflection mirrors 10a, 10b through the lens 7 and the filter 6 in a direction in parallel with the moving direction of the light source 5.

An exposure stand 11 is provided at a position adjacent the second pair of the reflection mirrors 10a and 10b for exposing the microcapsule sheet 12 to image carrying light. For this purpose, the final reflection mirror 10c is provided between the reflection mirror 10b and the exposure stand 11 for directing the light reflected from the second pair of reflection mirrors 10a and 10b toward the exposure stand 11. Accordingly, a latent image corresponding to the image of the original 4a is formed on the microcapsule sheet 12 positioned on the exposure stand 11.

The second pair of the reflection mirrors 10a and 10b are normally stationarily positioned. However, these mirrors are movable together in the axial direction of the shaft 13 so as to control an optical path length in accordance with the change in copying magnification such as size enlargement or reduction. Further, provided that a feeding velocity of the microcapsule sheet 12 is represented by "V", and the copying magnification is represented by "m", the moving speed of the halogen lamp 5a and the mirror 8 is set to V/m, and the moving speed of the first pair of reflection mirrors 9a and 9b is set to V/(2 m) in order to obtain the latent image on the microcapsule sheet 12 positioned on the exposure stand 11 with the desired magnification (m).

The elongated microcapsule sheet 12 is of a rolled form and a leading end portion of the sheet 12 is provided with a leader tape portion. More specifically, at substantially a center portion of the interior of the copying machine 1, a magazine or magazine unit 16 is disposed.

Further, a feed roller 19 is rotatably provided at a position downstream of a path 17 and another feed rollers 20, 20 are rotatably provided at a position downstream of the feed roller 19. One of the feed rollers 20 is movable toward and away from the remaining feed roller 20. Between the feed rollers 19 and 20, the exposure stand 11 is provided. Moreover, a dancer roller or a tension control roller 21 is provided for controlling a sheet slack of the microcapsule sheet 12 and a separation roller 23 is rotatably provided for separating the microcapsule sheet 12 from the developer sheet 28. A pressure developing unit 22 having a large diameter pressure roller 22a and a back-up roller 22b is positioned between the dancer roller 21 and the separation roller 23 for pressure developing operation. A take-up shaft 24, as a driving mechanism for the sheet winding shaft; of the copying machine is provided for taking up the light exposed microcapsule sheet 12. Thus, the microcapsule sheet path is defined by, in order, the feed roller 19, an upper surface of the exposure stand 11, the feed rollers 20, the dancer roller 21, the pressure developing unit 22, the separation roller 23 and the takeup shaft 24. Incidentally, a partitioning wall 2a is provided horizontally so as to prevent the microcapsule sheet 12 positioned at an upstream portion of the exposure stand 11 from being irradiated with light.

The feeding velocity of the microcapsule sheet 12 is controlled at a constant speed, and the feeding movement is in synchronism with the movements of the mirrors 8, 9a and 9b. Accordingly, a latent image in line-by-line basis is successively provided on the microcapsule sheet 12 when it passes through the exposure stand 11.

An automatic sheet loading function is given in the image recording apparatus of this embodiment. By the automatic loading function, the leader tape portion of the rolled microcapsule sheet 12 can be automatically directed along the sheet path and is wound around the take-up shaft 24. Therefore, the subsequent microcapsule sheet 12 can be automatically installed at the sheet path. A separation chute 27 is provided at a position downstream of the separation roller 23 so as to direct the leader portion toward the take-up shaft 24. Furthermore, a guide 25 is provided immediately near the take-up shaft 24 for guiding the winding of the leader portion over the take-up shaft 24.

At a position below the pressure developing unit 22, a sheet cassette 29 is installed in which a stack of the cut developer sheets 28 are stored. At a position above the cassette 29 is provided a sheet feed mechanism 30 which includes a suction means so as to deliver each one of the developer sheets 28 toward the pressure developing unit 22. Between the sheet feed mechanism 30 and the pressure developing unit 22, sheet feed rollers 31a, 31b, 31c and a sheet feed guide 31d are provided. The developer sheet 28 is thus delivered to an upstream side of the pressure developing unit 22.

Further, a thermal fixing unit 32 is provided at a position downstream of the separation chute 27. The thermal fixing unit 32 includes a heat roller 32a and a discharge roller 32b. A discharge tray 33 is provided at a position downstream of the thermal fixing unit 32 for receiving the developer sheet 28 in which a visible output image is formed.

The general operation of the copying machine 1 will be described hereunder.

When a copy start key, not shown, is manipulated, the reflection mirror 8 and the halogen lamp 5a are moved at a speed V/m, and the first pair of reflection mirrors 9a and 9b are moved at a speed V/(2 m) assuming that the microcapsule sheet 12 is fed at a speed of (V) with aiming at image magnification of (m). Since the feeding speed of the microcapsule sheet 12 is synchronized with the moving speeds of the mirrors 8, 9a and 9b, a line latent image is successively formed on the microcapsule sheet 12 when it passes over the exposure stand 11.

The microcapsule sheet 12 which carries the latent image is further transferred toward the pressure developing unit 22, and at the same time, the developer sheet 28 is fed thereto by the sheet feed mechanism 30 and the feed rollers 31a, 31b and 31c. The latent image surface of the microcapsule sheet 12 is superposed with the developer material surface of the developer sheet 28 at the pressure developing unit 22, and these are pressed together. Therefore, unexposed microcapsule sheets 12 are ruptured to provide a chromogenic reaction with the developer materials of the developer sheet 28, to thereby form a visible color image on the developer sheet 28.

The microcapsule sheet 12 passed through the pressure developing unit 22 is separated from the developer sheet 28 by the separation roller 23. Then, the developer sheet 28 is fed to the thermal fixing unit 32 where the coloring of the visible image is promoted by the heat roller 32a. The thus treated developer sheet 28 is discharged out of the thermal fixing unit by the discharge roller 32b and is fed onto the discharge tray 33.

The magazine or magazine unit 16 for the microcapsule sheets 12 will be described in detail hereunder with reference to FIGS. 4 to 7A and 7B.

Figure 4:
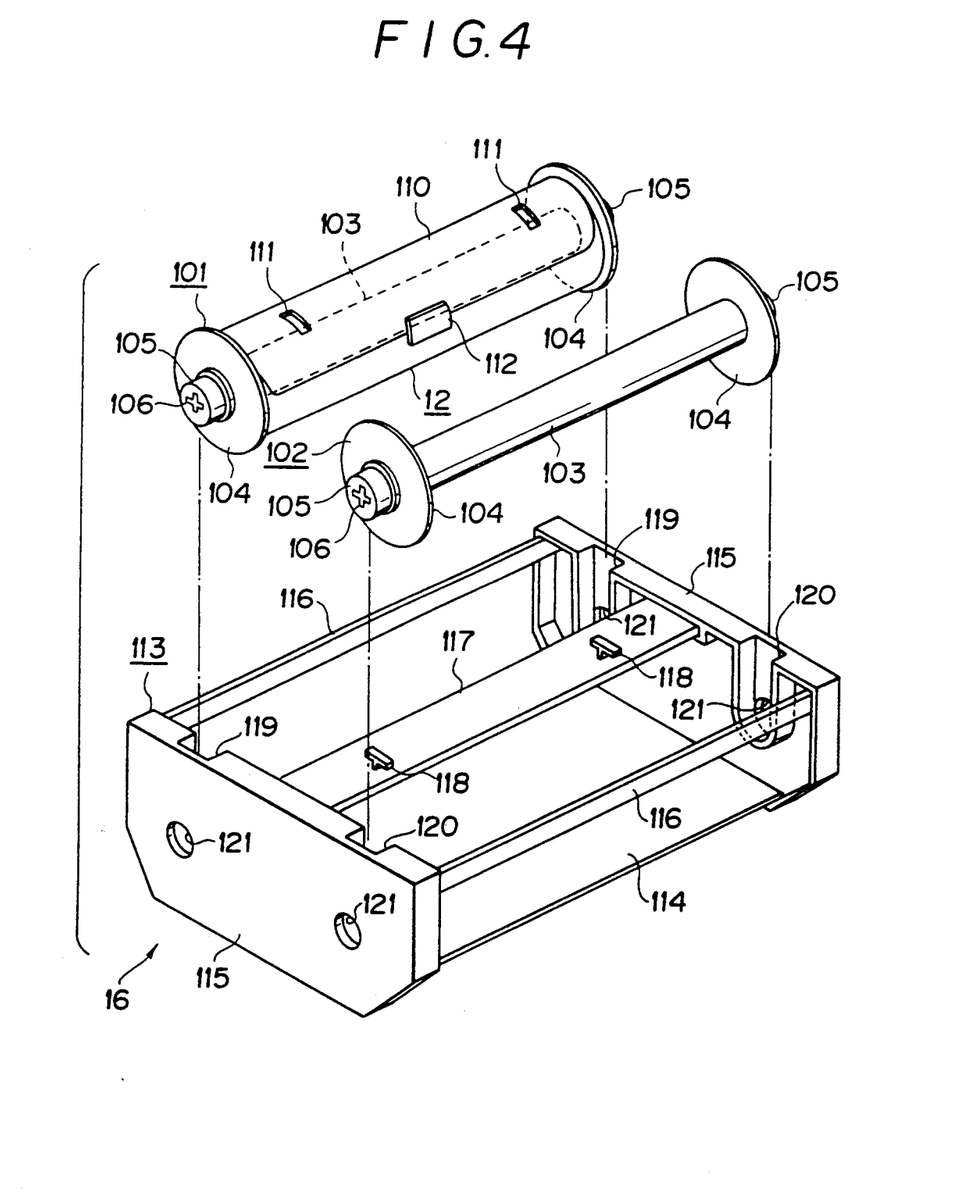
FIG. 4 is a developed view of a magazine for a microcapsule sheet of the copying machine according to this invention.

Referring to FIG. 4, a winding shaft 101 on the sheet feed side, i.e. a sheet feed shaft in this meaning, and another winding shaft 102 on the sheet take-up side, i.e. a sheet take-up shaft in this meaning, have substantially the same structure so that they are commonly used. These shafts 101 and 102 each comprises a core member 103 and flange members 104 both being fitted and mounted to both ends of the core member 103, and support shafts 105 of the core member 103 are projected outward from the flange members 104. Each of the support shafts 105 has an extreme outer end face on which a cross shaped recess 106 is formed as an engaging portion for driving the shaft 105 and, hence, the core member 103. The sheet take-up shaft 102 is driven by the engagement of the engaging portion 106 thereof with the take-up shaft 24 mentioned hereinbefore.

Figure 5:
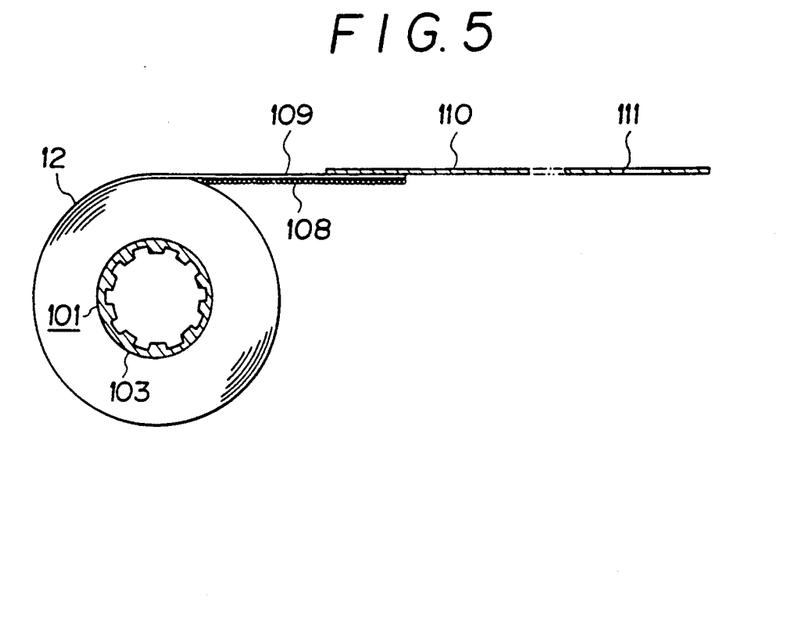
FIG. 5 is an end view of a winding shaft around which the microcapsule sheet is wound.

As shown in FIGS. 4 and 5, the microcapsule sheet 12 before use as a photosensitive pressure sensitive image recording medium is wound around the core member 103 of the sheet feed shaft 101 and supported, in the light shielding state, between the flange members 104. The microcapsule sheet 12 is formed of a base sheet or substrate 109 and a microcapsule 108 containing a color copying coloring precursor and a light setting resin.

To the leading end of the mcirocapsule sheet 12 is bonded a leader tape 110 which has a front end portion in which a pair of engaging holes 111 are formed. When the microcapsule sheet 12 is enveloped, before mounting, in the winding state on the core member, the front end of the leader tape 110 is bonded by a tape stopper 112.

As shown in FIG. 4, the sheet feed shaft 101 and the sheet take-up shaft 102 are demountably accommodated in a magazine body 113. The magazine body 113 includes a flat plate-like center frame 114 constituting a bottom plate of the magazine body 113 and end plates 115 attached vertically to both the longitudinal ends of the center frame 114. A pair of reinforcing plates 116 are stretched between the end plates 115 on both the lateral sides of the center frame 114. A leader holder 117 is further stretched between the upper central portion of the end plates 115 and a pair of engaging projections 118 are provided for the upper surface of the leader holder 117 for the engagement with the engaging holes 111 of the microcapsule sheet 12 when the sheet feed shaft 101 with the microcapsule sheet 12 wound is newly mounted.

A pair of grooves 119 and 120 each having a U-shape are formed to the inner surfaces of the respective end plates 115 for detachably supporting the sheet feed shaft 101 and the sheet take-up shaft 102 fitted through upper openings in parallel to the reinforcing plates 116 and the leader holder 117 so that both the shafts 101 and 102 are rotatable in the magazine body 113. The U-shaped grooves 119 and 120 are disposed on both the sides of the leader holder 117 and are symmetric with respect to a center line of the magazine body 113. Through holes 121 are formed to the end plates 115 at the lower portions of the respective grooves 119 and 120, and when the magazine body 113 with the sheet feed shaft and the sheet take-up shaft being mounted is mounted in a predetermined portion of the copying machine 1, the engaging portions 106 formed at the end faces of the respective core members 103 are engaged with the take-up shaft 24 on the driving side through the through holes 121.

In the present embodiment, as shown in FIG. 4, the magazine body 113 has a structure substantially laterally symmetric with respect to the central leader holder 117. Accordingly, each of the shafts 101 and 102 can be mounted either one pair of the grooves 119 or 120, and when the magazine body 113 is mounted in the copying machine, the magazine body 113 is rotated by 180° so that the sheet feed shaft 101 faces a sheet feed mechanism disposed in the copying machine.

The magazine 16 provided with the magazine body 113 of the structure described above will operate in the following manner with reference to FIGS. 6A to 6E.

Figure 6A:
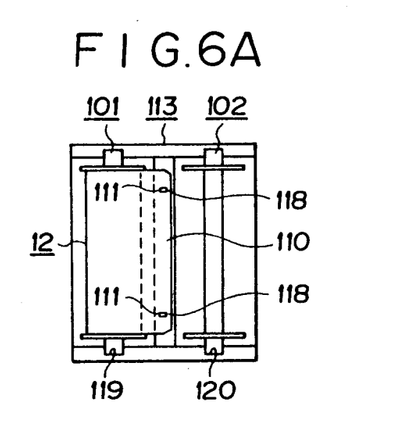
FIGS. 6A to 6E are schematic plan views for showing a series of operations for exchanging a used microcapsule sheet with new one according to this invention.

First, referring to FIG. 6A, when the magazine 16 is used, the sheet feed shaft 101 around which the microcapsule sheet 12 is wound is mounted to one pair of grooves 119 of the magazine body 113, and the engaging holes 111 formed in the leader tape 110 bonded to the front end portion of the microcapsule sheet 12 are engaged with the projections 118 formed at the leader holder 117 of the magazine body 113. To the other pair of grooves 120 is mounted the sheet take-up shaft 102 around which the microcapsule sheet 12 after used will be taken up. The magazine body 113 in this state is then mounted in the predetermined position in the copying machine 1 through the opening 43, shown in FIG. 2, formed at the front portion of the housing 2 of the copying machine 1.

Thereafter, when the copying machine 1 is operated by controlling the control panel 45, the microcapsule sheet 12 is fed from the sheet feed shaft 101 to be subjected to the copying operation and the microcapsule sheet 12 after the copying operation is wound around the sheet take-up shaft 102.

Figure 6B:
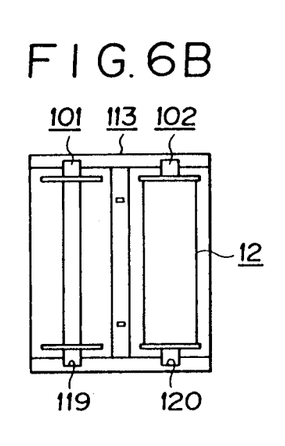
Figure 6C:
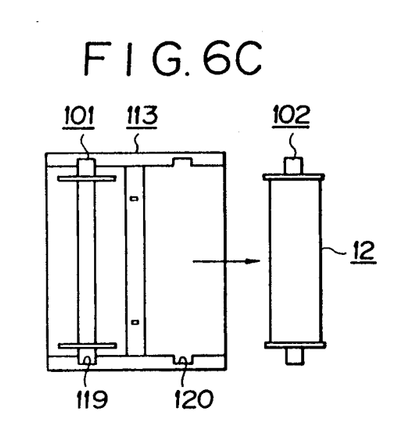

Next, as shown in FIG. 6B, when all the microcapsule sheet 12 has been taken up around the sheet take-up shaft 102, it is necessary to exchange the used microcapsule sheet 12 for a new one. In such case, as shown in FIG. 6C, the door 41 and then the cover 44 of the housing 2 of the copying machine 1 are opened and the magazine body 113 in the state of FIG. 6B is taken out from the copying machine through the opening 43, and the sheet take-up shaft 102 around which the used microcapsule sheets 12 are wound is removed from the grooves 120 of the magazine body 113.

Figure 6D:
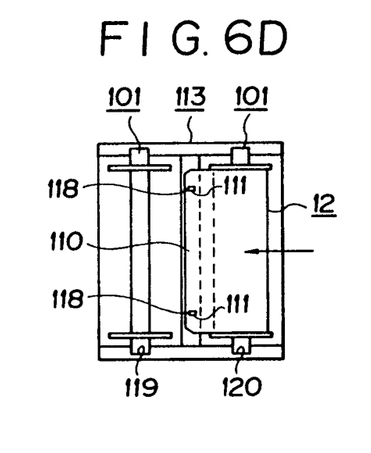

Thereafter, as shown in FIG. 6D, a new winding shaft 101 around which a new microcapsule sheet is wound is fitted into the grooves 120 and the engaging holes 111 of the leader tape 110 of this new microcapsule sheet 12 are engaged with the projections 118 of the magazine body 113. The magazine body 113 is then rotated by 180° and mounted in the copying machine 1. As easily understood, in this state, the newly mounted winding shaft is used as a new sheet feed shaft 101 and the vacant shaft, which is referred to as the sheet feed shaft 101 in the foregoing operation, is re-used as a sheet take-up shaft 102.

Accordingly, the magazine body 113 and the winding shaft on the sheet take-up side are re-used without throwing them away, thus being advantageous in the economical viewpoint of the copying machine itself.

Figure 6E:
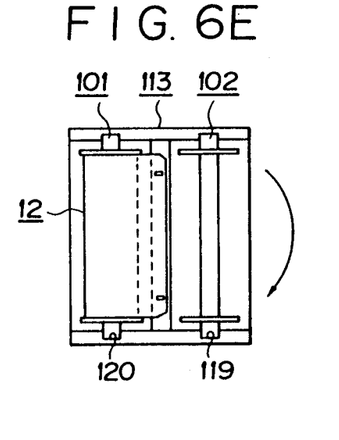
Figure 7A:
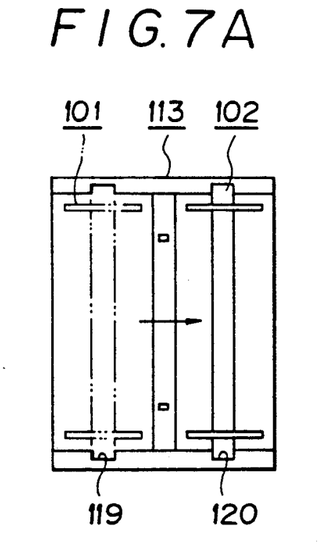
FIGS. 7A and 7B are also schematic plan views of another operation mode for the exchanging operation.
Figure 7B:
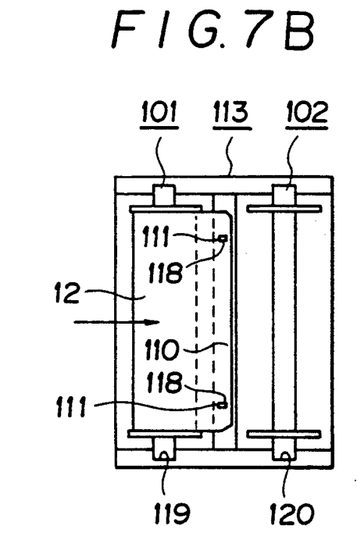

In a modification, the working operations shown in FIGS. 6D and 6E may be substituted by the operations represented by FIGS. 7A and 7B, respectively, with respect to the microcapsule sheet exchanging operation.

Namely, as shown in FIG. 6C, after all the microcapsule sheet 12 is wound around the sheet take-up shaft 102 and the magazine body 113 is taken out from the copying machine 1, the sheet take-up shaft 102 is removed from the grooves 120. In this state, as shown in FIGS. 7A and 7B, the vacant sheet feed shaft 101 is changed from the grooves 119 to the grooves 120, and thereafter, a new winding shaft around which a new microcapsule sheet 12 is wound is mounted to the grooves 119 as a new sheet feed shaft 101. The engaging holes 111 of the leader tape 110 of this new microcapsule sheet 12 are engaged with the projections 118 of the magazine body 113. With this state, the magazine body 113 is mounted in the copying machine without rotating the magazine body 113 by 180°. It is to be understood that this invention is not limited to the described preferred embodiment and many other changes and modifications may be made without departing from the scope of the appended claim.

For example, the shapes of the winding shafts 101 and 102 and the magazine body 113 may be changed in design as occasion demands.

What is claimed is:

1. A magazine unit, for an image recording medium, of an image recording apparatus comprising an outer housing at which an opening is formed, said magazine unit comprising:
   a magazine body to be mounted in the housing of the image recording apparatus through the opening;
   a first winding shaft around which a sheet-like image recording medium before use is wound, said first winding shaft being detachably mounted to the magazine body; and
   a second winding shaft around which the sheet-like image recording medium after the use from the first winding shaft is to be taken up, said second winding shaft being detachably mounted to the magazine body, said first and second winding shafts having substantially the same structure so as to be used commonly.

2. A magazine unit according to claim 1, wherein each of said first and second winding shafts comprises a cylindrical core member around which the sheet-like image recording medium is wound, a pair of flange members secured to both end portions of the core member, a pair of support shafts projected from the core member outward from the flange members, and a pair of engaging portions formed at the support shafts to be engaged with a winding shaft driving means of the image recording apparatus so that the winding shafts are rotated.

3. A magazine unit according to claim 2, wherein each of said engaging portions is a cross-shaped recess formed in a projected end face of the support shaft.

4. A magazine unit according to claim 1, wherein said magazine body comprises:
   a flat-plate like center frame constituting a bottom plate of the magazine body;
   a pair of end plates secured to both longitudinal ends of the center frame in a vertically standing manner, said end plates being provided with winding shaft support portions for rotatably and detachably supporting the first and second winding shafts, respectively;
   a pair of reinforcing plates secured to and stretched between the end plates on both lateral sides of the center frame; and
   a holding member stretched between substantially the center portions of the end plates in parallel to the reinforcing plates for holding the image recording medium.

5. A magazine unit according to claim 4, wherein said holding member has an upper surface on which are formed at least one projection which is engaged with an engaging hole formed at a leading end of the image recording medium wound on either one of the first and second winding shafts on a recording medium feed side.

6. A magazine unit according to claim 4, wherein said winding shaft support portions comprise two pairs of grooves formed on inner surfaces of both end plates, each of two pairs thereof being arranged on both sides of the holding member so that the first and second winding shafts are mounted in each of these pairs of grooves in parallel with the holding member on both the recording medium feed side and take-up side, each of said grooves having a U-shape with an opening for the mounting of the winding shaft and wherein said end plates are provided with holes at lower portions of said grooves, respectively, through which the first and second winding shafts are engaged with a driving means of the image recording apparatus for rotating the winding shafts.

7. A magazine unit according to claim 4, wherein said magazine body has a structure laterally symmetric with respect to the holding member so that each of the first and second winding shafts is freely mounted to either one of two pairs of the grooves formed at the end plates, whereby said magazine body can be mounted in the image recording apparatus in a manner rotated by 180°.

8. A magazine unit according to claim 1, wherein said image recording medium is a microcapsule sheet comprising a base sheet and a microcapsule coated on the base sheet and containing a color copying coloring precursor and a light setting resin.

9. A magazine unit according to claim 1, wherein the housing of the image recording apparatus is provided with a front surface to which the opening for the mounting of the magazine unit is formed, a cover for covering the opening is attached to the front surface of the housing, and a door is provided for a front surface of the housing to be opened and closed for an access to an interior of the housing.

10. A magazine unit, for an image recording medium, of an image recording apparatus comprising an outer housing at which an opening is formed, said magazine unit comprising:

a magazine body to be mounted in the housing of the image recording apparatus through the opening, said magazine body having a structure symmetric with respect to a center line thereof and having two support portions disposed symmetrically with respect to the center line;

a first winding shaft around which a sheet-like image recording medium before use is wound, said first winding shaft being detachably supported to one of the two support portions; and a second winding shaft around which the sheet-like image recording medium after the use from the first winding shaft is to be taken up, said second winding shaft being detachably supported to the other of the two support portions, said first and second winding shafts having substantially the same structure so as to be used commonly.

* * * * *